(12) United States Patent
Huang et al.

(10) Patent No.: US 10,490,473 B2
(45) Date of Patent: Nov. 26, 2019

(54) CHIP PACKAGE MODULE AND CIRCUIT BOARD STRUCTURE COMPRISING THE SAME

(71) Applicant: Industrial Technology Research Institute, Hsinchu (TW)

(72) Inventors: Shin-Yi Huang, Hsinchu County (TW); Yu-Min Lin, Hsinchu County (TW); Tao-Chih Chang, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 15/955,527

(22) Filed: Apr. 17, 2018

(65) Prior Publication Data

US 2019/0237373 A1    Aug. 1, 2019

(30) Foreign Application Priority Data

Feb. 1, 2018    (TW) .................................. 107103628

(51) Int. Cl.
*H01L 23/31*    (2006.01)
*H01L 23/367*    (2006.01)
(Continued)

(52) U.S. Cl.
CPC ........ *H01L 23/315* (2013.01); *H01L 23/3107* (2013.01); *H01L 23/3114* (2013.01);
(Continued)

(58) Field of Classification Search
CPC ....... H01L 2924/151; H01L 2924/1515; H01L 2924/1517; H01L 23/3107; H01L 23/3114;
(Continued)

(56) References Cited

U.S. PATENT DOCUMENTS 7,935,570 B2    5/2011    Lin et al.
8,164,158 B2    4/2012    Lin
(Continued)

FOREIGN PATENT DOCUMENTS

TW    201316853 A1    4/2013
TW    I508255 B    11/2015
TW    201803057 A    1/2018

OTHER PUBLICATIONS

Taiwan Patent Office, Office Action, Patent Application Serial No. 107103628, dated Aug. 22, 2018, Taiwan.

*Primary Examiner* — Scott B Geyer

(57) ABSTRACT

A chip package module includes an encapsulation layer, a chip, a substrate and a plurality of blind-hole electrodes. The encapsulation layer includes a first surface and a second surface opposite to the first surface. The chip includes a third surface and a fourth surface opposite to the third surface. A metal bump is fabricated on the third surface of the chip. The chip is embedded into the encapsulation layer from the first surface of the encapsulation layer. The metal bump is exposed from the first surface of the encapsulation layer. The substrate includes a metal layer, wherein the metal layer of the substrate is bonded to the chip through the metal bump. The plurality of blind-hole electrodes pass through the second surface of the encapsulation layer and are electrically connected to the metal layer of the substrate.

19 Claims, 12 Drawing Sheets

(51) Int. Cl.
  *H01L 23/00* (2006.01)
  *H01L 23/48* (2006.01)
  *H01L 23/522* (2006.01)

(52) U.S. Cl.
  CPC ...... *H01L 23/3135* (2013.01); *H01L 23/3157* (2013.01); *H01L 23/367* (2013.01); *H01L 23/481* (2013.01); *H01L 23/5226* (2013.01); *H01L 24/16* (2013.01); *H01L 24/25* (2013.01); *H01L 23/3121* (2013.01); *H01L 2924/1515* (2013.01); *H01L 2924/1517* (2013.01); *H01L 2924/1811* (2013.01); *H01L 2924/1815* (2013.01); *H01L 2924/18161* (2013.01)

(58) Field of Classification Search
  CPC ............. H01L 23/3121; H01L 23/3135; H01L 2924/181; H01L 2924/1811; H01L 2924/1815; H01L 2224/18–2224/255; H01L 24/18; H01L 24/20; H01L 24/23; H01L 24/24; H01L 24/25; H01L 2924/18161; H01L 23/3675
  See application file for complete search history.

(56) References Cited

U.S. PATENT DOCUMENTS

| | | | |
|---|---|---|---|
| 8,940,557 B2 | 1/2015 | Kim et al. | |
| 9,059,160 B1 | 6/2015 | Sutardja | |
| 9,601,472 B2 | 3/2017 | Keser et al. | |
| 2008/0029890 A1 | 2/2008 | Cheng | |
| 2008/0246126 A1* | 10/2008 | Bowles | H01L 23/3114 257/659 |
| 2009/0242255 A1 | 10/2009 | Taniguchi et al. | |
| 2010/0140736 A1 | 6/2010 | Lin et al. | |
| 2011/0062549 A1 | 3/2011 | Lin | |
| 2013/0075924 A1* | 3/2013 | Lin | H01L 24/19 257/774 |
| 2015/0318262 A1* | 11/2015 | Gu | H01L 23/49811 257/738 |
| 2016/0118333 A1 | 4/2016 | Lin | |

* cited by examiner

CHIP PACKAGE MODULE AND CIRCUIT BOARD STRUCTURE COMPRISING THE SAME

CROSS REFERENCE TO RELATED APPLICATIONS

This application claims priority of Taiwan Patent Application No. 107103628, filed on Feb. 1, 2018, the entirety of which is incorporated by reference herein.

TECHNICAL FIELD

The disclosure relates to a chip package module and a circuit board structure comprising the same.

BACKGROUND

In a power semiconductor package structure, a power chip is first assembled to a leadframe using solder material, and then a wire bonding is performed. However, the wire bonding method does not contribute to dissipating the heat of the components, and the reliability is also poor. At present, in the industry, the power chip is mounted on the substrate by the solder material using a flip-chip technique. Although this method can improve electrical conductivity and thermal conductivity of the package structure, when a large current passes through the solder material, the solder material that is not resistant to high current will generate hole-shaped defects (kirkendall void) in the material structure, resulting in a breakdown between the upper and lower components connected by the solder material after long-term use or during a reliability testing process.

Therefore, development of a package structure with high heat dissipation efficiency and high current resistance is desirable.

SUMMARY

In accordance with one embodiment of the disclosure, a chip package module is provided. The chip package module includes an encapsulation layer, a chip, a substrate and a plurality of blind-hole electrodes. The encapsulation layer includes a first surface and a second surface opposite to the first surface. The chip includes a third surface and a fourth surface opposite to the third surface. A metal bump is fabricated on the third surface of the chip. The chip is embedded into the encapsulation layer from the first surface of the encapsulation layer. The metal bump is exposed from the first surface of the encapsulation layer. The substrate includes a metal layer, wherein the metal layer of the substrate is bonded to the chip through the metal bump. The plurality of blind-hole electrodes pass through the second surface of the encapsulation layer and are electrically connected to the metal layer of the substrate.

In accordance with one embodiment of the disclosure, a circuit board structure is provided. The circuit board structure includes a circuit board and the above-mentioned chip package module. The circuit board includes a circuit distribution layer, wherein the circuit distribution layer is disposed adjacent to at least one surface of the circuit board. The above-mentioned chip package module is embedded in the circuit board, wherein at least one of the plurality of blind-hole electrodes of the chip package module is electrically connected to the circuit distribution layer of the circuit board.

In accordance with one embodiment of the disclosure, a chip package module is provided. The chip package module includes an encapsulation layer, a chip, a substrate and a plurality of plating through hole electrodes. The encapsulation layer includes a first surface and a second surface opposite to the first surface. The chip includes a third surface and a fourth surface opposite to the third surface. A metal bump is fabricated on the third surface of the chip. The chip is embedded into the encapsulation layer from the first surface of the encapsulation layer. The metal bump is exposed from the first surface of the encapsulation layer. The substrate includes a metal layer, wherein the metal layer of the substrate is bonded to the chip through the metal bump. The plurality of plating through hole electrodes pass through the encapsulation layer and the substrate, and are electrically connected to the metal layer of the substrate.

In accordance with one embodiment of the disclosure, a circuit board structure is provided. The circuit board structure includes a circuit board and the above-mentioned chip package module. The circuit board comprises a circuit distribution layer, wherein the circuit distribution layer is disposed adjacent to at least one surface of the circuit board. The above-mentioned chip package module is embedded in the circuit board, wherein at least one of the plurality of blind-hole electrodes of the chip package module is electrically connected to the circuit distribution layer of the circuit board.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
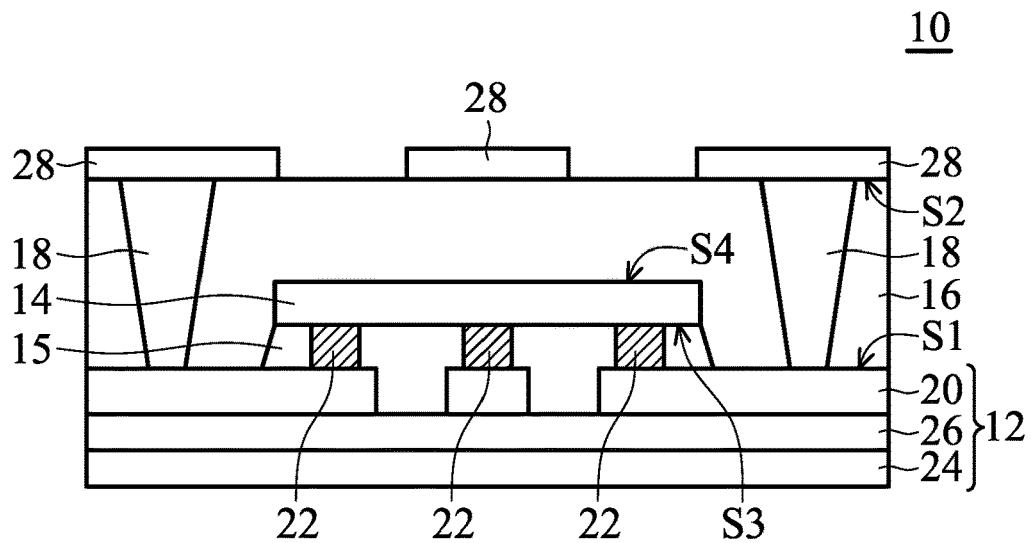
FIGS. 1-4 are cross-sectional views of a chip package module in accordance with the first embodiment of the disclosure.

The following description is the embodiments of carrying out the disclosure. This description is made for the purpose of illustrating the general principles of the disclosure and should not be taken in a limiting sense. The scope of the disclosure is determined by reference to the appended claims.

The foregoing and other technical contents of the embodiments of the present disclosure will be clearly seen in the following detailed description of the embodiments with reference to the accompanying drawings. The directional terms, for example, "upper", "lower", "front", "back", "left", "right" and the like mentioned in the following embodiments are just directions with reference to the attached drawings. Therefore, the directional terms used are intended to illustrate and not to limit the disclosure. Also, in the following embodiments, the same or similar components will use the same or similar reference numerals.

FIGS. 1-4 are cross-sectional views of a chip package module in accordance with the first embodiment of the disclosure.

Referring to FIG. 1, in this embodiment, a chip package module 10 includes an encapsulation layer 16, a chip 14, and a substrate 12. The encapsulation layer 16 includes a first surface 51 and a second surface S2 opposite to the first surface 51. The chip 14 includes a third surface S3 and a fourth surface S4 opposite to the third surface S3. At least one metal bump 22 is fabricated on the third surface S3 of the chip 14. The chip 14 is embedded into the encapsulation layer 16 from the first surface 51 of the encapsulation layer 16. The metal bump 22 is exposed from the first surface 51 of the encapsulation layer 16. The substrate 12 includes a metal layer 20. The metal layer 20 of the substrate 12 is bonded to the chip 14 through the metal bump 22. In some embodiments, the metal layer 20 may be a patterned metal layer. The chip package module 10 further comprises a plurality of blind-hole electrodes 18. The plurality of blind-hole electrodes 18 are located at at least one side around the chip 14 and pass through the second surface S2 of the encapsulation layer 16. The plurality of blind-hole electrodes 18 are electrically connected to the metal layer 20 of the substrate 12.

In some embodiments, the substrate 12 of the chip package module 10 may be a copper-clad ceramic substrate, a copper-plated ceramic substrate, a printed circuit board or an aluminum substrate, but not limited thereto. In this embodiment, the substrate 12 further includes a metal layer 24 and an insulating layer 26. The metal layer 24 is disposed opposite to the metal layer 20. The insulating layer 26 is disposed between the metal layer 20 and the metal layer 24. In some embodiments, the metal layer 20 and the metal layer 24 may include copper or aluminum, or other metals. In some embodiments, the insulating layer 26 may include high-heat-dissipating insulating materials, such as inorganic ceramic insulating materials or organic insulating materials in which polymer materials are mixed with high-heat-dissipating inorganic particles.

In some embodiments, the metal bump 22 fabricated on the chip 14 of the chip package module 10 may include solder alloy, copper, silver, indium, gold, palladium, titanium, manganese, cobalt or an alloy thereof. In some embodiments, the metal bump 22 does not contain solder alloy. In this embodiment, the chip 14 is bonded to the metal layer 20 (e.g., a copper metal layer) of the substrate 12 through the metal bump 22 (e.g., a copper bump) to form a metal-metal (e.g., copper-copper) bonding, but the disclosure is not limited thereto.

In some embodiments, the chip 14 of the chip package module 10 may be a power chip, for example, a power chip applied to 650 volts above, but the disclosure is not limited thereto. In some embodiments, a power component disposed on the chip 14 of the chip package module 10 may be an insulated gate bipolar transistor, a gallium nitride transistor, or a metal oxide semiconductor field effect transistor.

In some embodiments, the encapsulation layer 16 may include insulating materials. In this embodiment, an underfill 15 is further filled between the chip 14 and the substrate 12. In some embodiments, the underfill 15 may include insulating materials. The underfill 15 and the encapsulation layer 16 may include the same or different materials.

In this embodiment, the chip package module 10 further includes a circuit distribution layer 28 which is formed on the encapsulation layer 16 and the blind-hole electrodes 18. In some embodiments, the blind-hole electrodes 18 may include, for example, copper or other conductive metals. The chip 14 is electrically connected to the circuit distribution layer 28 through the metal layer 20 of the substrate 12 and the blind-hole electrodes 18.

Figure 2:
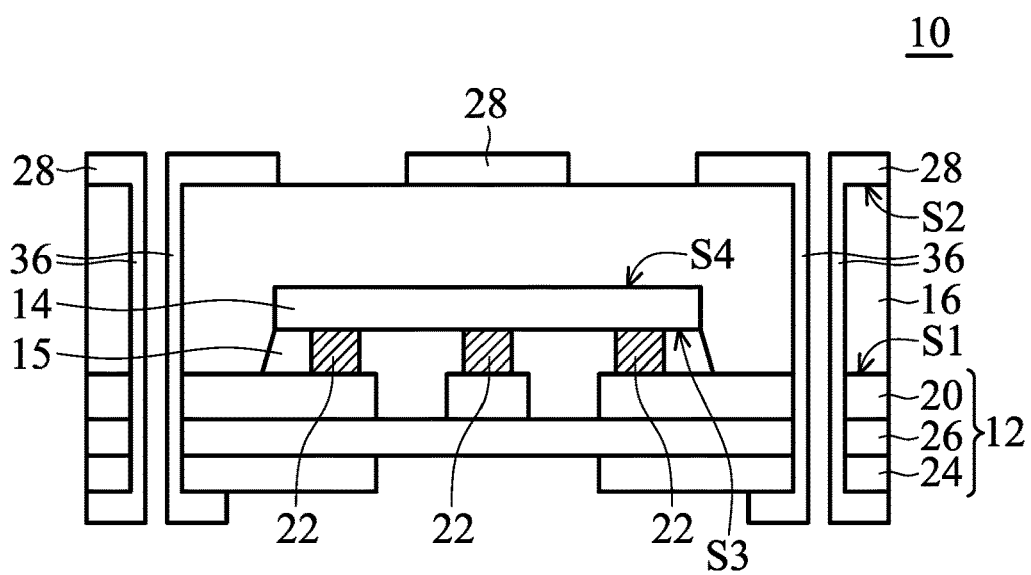
Figure 3:
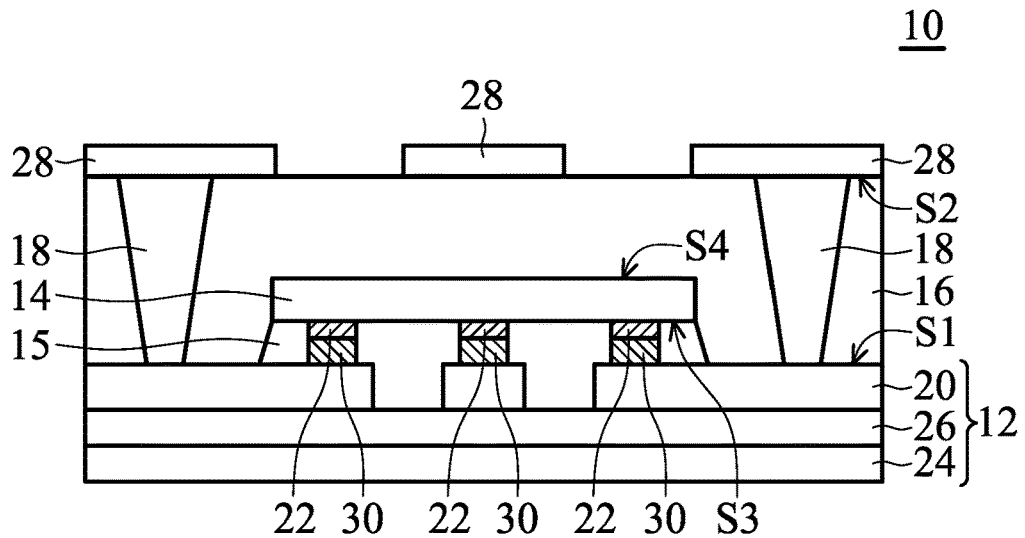
Figure 4:
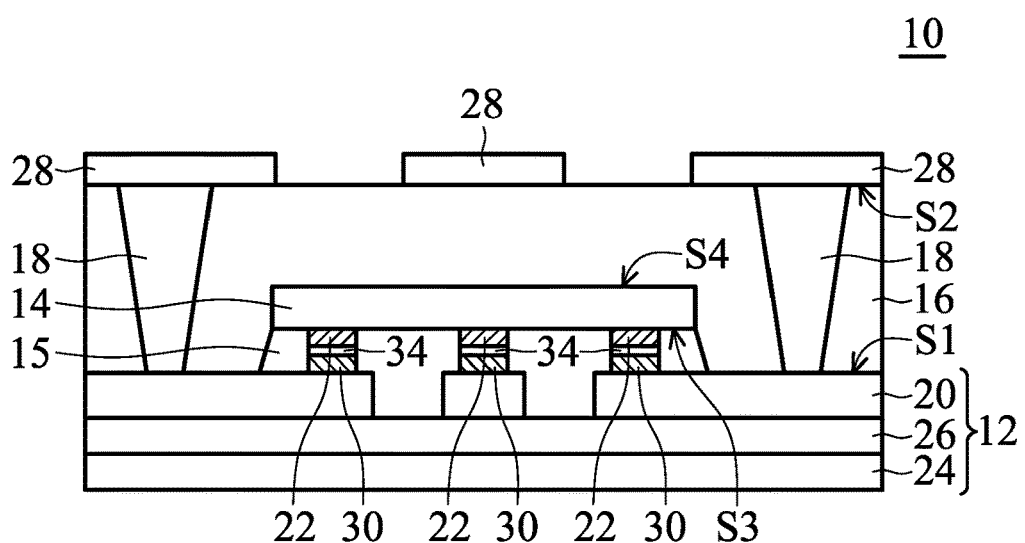

FIG. 2 is a cross-sectional view of a chip package module in accordance with the first embodiment of the disclosure. Referring to FIGS. 1 and 2, the distinction between the chip package module 10 of this embodiment and the chip package module 10 of FIG. 1 is that, in the chip package module 10 of this embodiment, a plurality of plating through hole electrodes 36 replace the blind-hole electrodes 18 of FIG. 1. The plating through hole electrodes 36 pass through the encapsulation layer 16 and the substrate 12. The connection manner between the chip 14 and the metal layer 20 of the substrate 12 may include the connection manner as shown in FIG. 3 or FIG. 4. In some embodiments, the plating through hole electrodes 36 may include, for example, copper or other conductive metals. The chip 14 is electrically connected to the circuit distribution layer 28 through the metal layer 20 of the substrate 12 and the plating through hole electrodes 36.

FIG. 3 is a cross-sectional view of a chip package module in accordance with the first embodiment of the disclosure. Referring to FIGS. 1 and 3, the distinction between the chip package module 10 of this embodiment and the chip package module 10 of FIG. 1 is that, in the chip package module 10 of this embodiment, between the chip 14 and the metal layer 20 of the substrate 12, a metal bump 30 is further fabricated between the metal layer 20 of the substrate 12 and the metal bump 22. The chip 14 is bonded to the metal layer 20 of the substrate 12 through the metal bump 22 and the metal bump 30. The metal bump 30 may include solder alloy, copper, silver, indium, gold, palladium, titanium, manganese, cobalt or an alloy thereof, but not limited thereto. In some embodiments, the metal bump 30 does not contain solder alloy.

FIG. 4 is a cross-sectional view of a chip package module in accordance with the first embodiment of the disclosure. Referring to FIGS. 3 and 4, the distinction between the chip package module 10 of this embodiment and the chip package module 10 of FIG. 3 is that, in the chip package module 10 of this embodiment, between the chip 14 and the metal layer 20 of the substrate 12, a metal bump 34 is further fabricated between the metal bump 30 and the metal bump 22. The chip 14 is bonded to the metal layer 20 of the substrate 12 through the metal bump 22, the metal bump 34 and the metal bump 30. The metal bump 22 and the metal bump 30 may be homogeneous metal (e.g., copper). The metal bump 34 may include solder alloy, copper, silver, indium, gold, palladium, titanium, manganese, cobalt or an alloy thereof, but not limited thereto. In some embodiments, the metal bump 34 does not contain solder alloy.

In one embodiment of the disclosure, a power chip is assembled on a substrate through a metal-metal bonding by the flip-chip manner, thereby eliminating a process step requiring high-precision alignment and making the overall circuit design more flexible. In addition, in one embodiment of the disclosure, a blind-hole (or plating through hole) electrode located around the chip in the chip package structure can also be used as a test circuit to test whether a gate and a source/drain continue to maintain electrical performance during the process.

Figure 5:
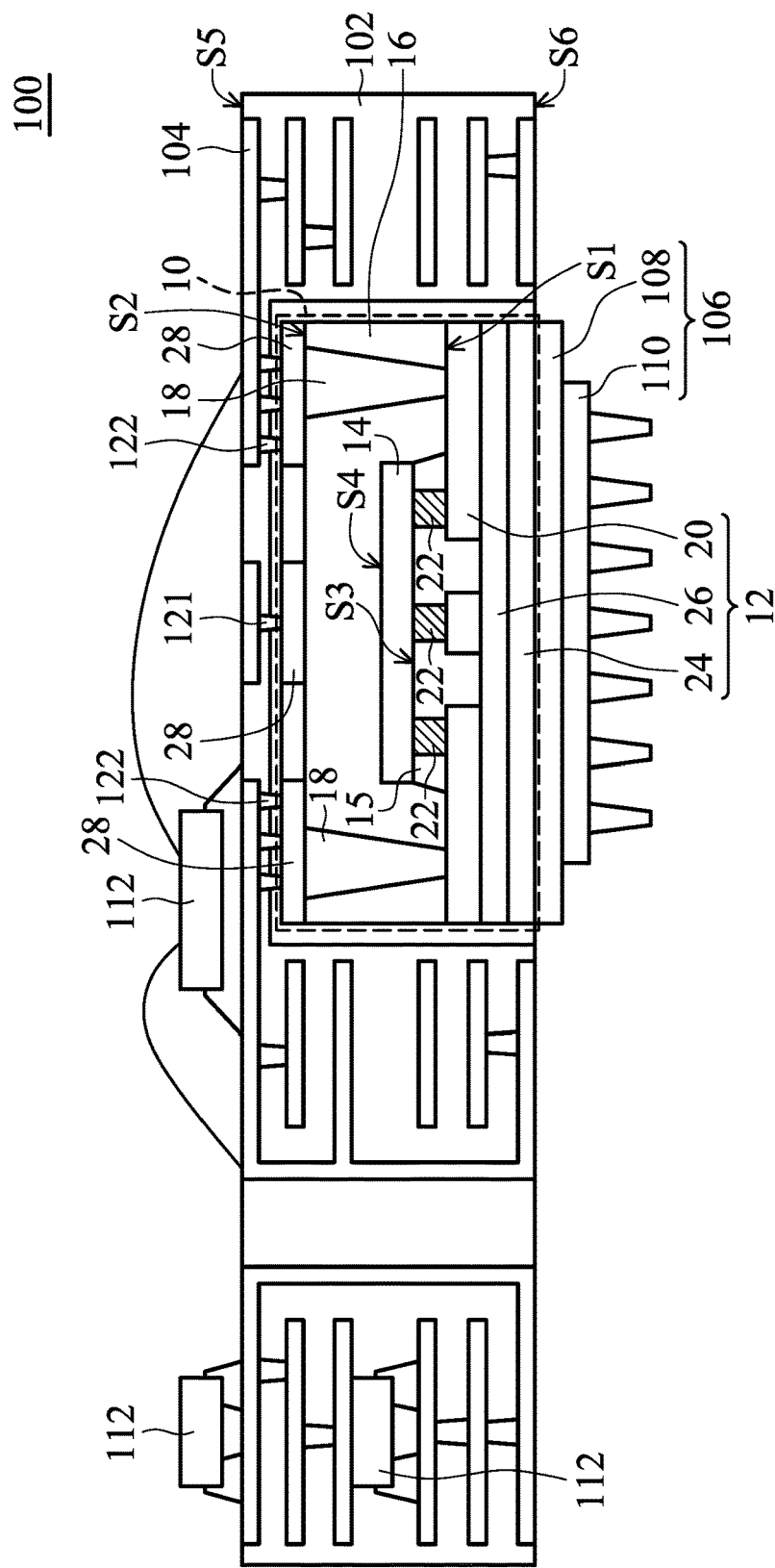
FIGS. 5 and 6 are cross-sectional views of a circuit board structure in accordance with the first embodiment of the disclosure.
Figure 6:
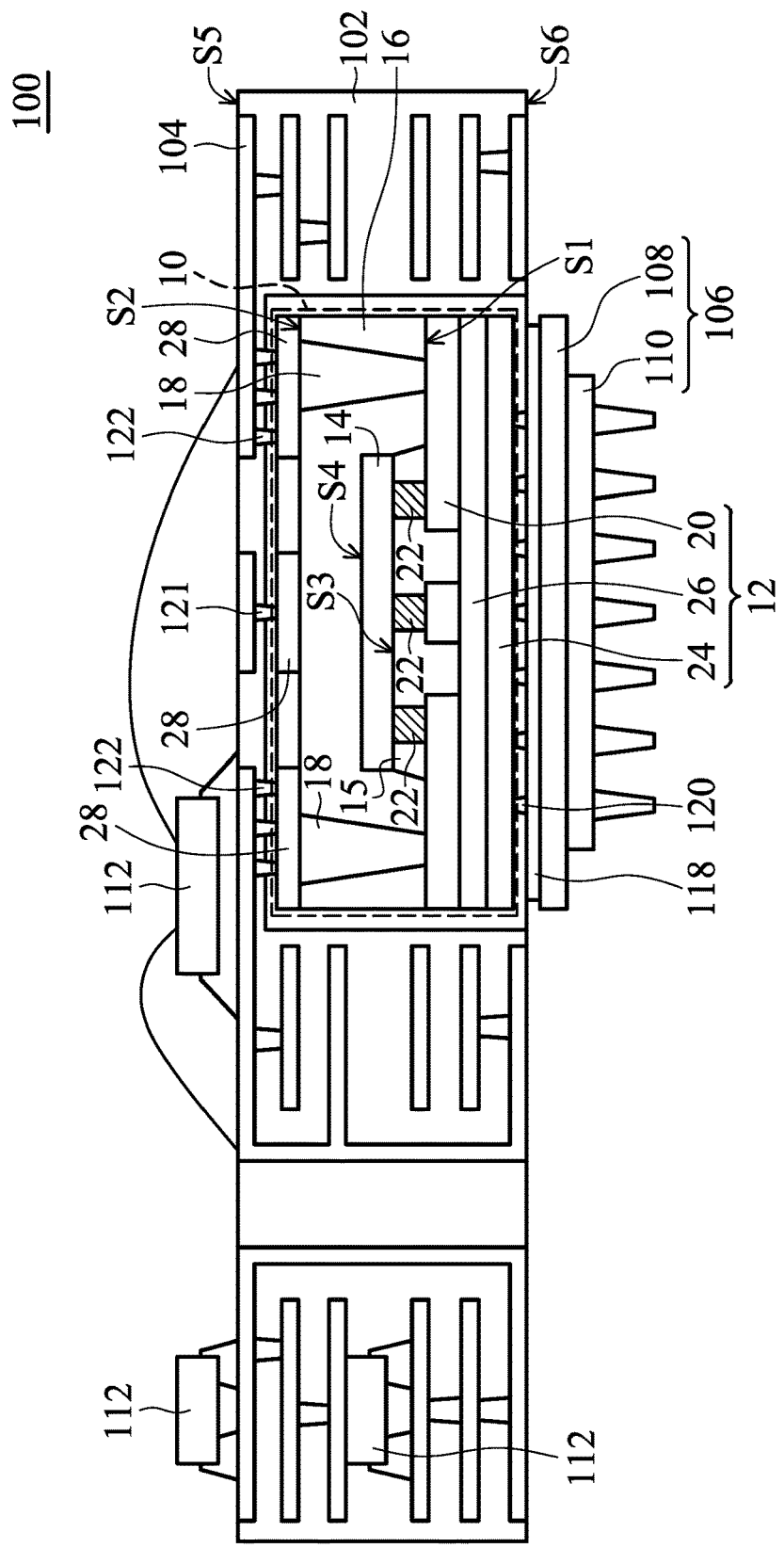

FIGS. 5 and 6 are cross-sectional views of a circuit board structure in accordance with the first embodiment of the disclosure.

Referring to FIG. 5, in this embodiment, a circuit board structure 100 includes a circuit board 102 and the chip package module 10 of FIG. 1, 2, 3 or 4 embedded in the circuit board 102. This embodiment takes the chip package module 10 of FIG. 1 as an example. The metal layer 24 of the substrate 12 is exposed from the circuit board 102. The circuit board 102 includes a circuit distribution layer 104 which is disposed adjacent to a surface S5 of the circuit board 102. The circuit distribution layer 28 of the chip package module 10 is electrically connected to the circuit distribution layer 104 of the circuit board 102 through a plurality of blind-hole electrodes 122. In some embodiments, the blind-hole electrodes 122 may include, for example, copper or other conductive metals. In this embodiment, the circuit distribution layer 104 of the circuit board structure 100 is disposed adjacent to the surface S5 of the circuit board 102, but not limited thereto. In other embodiments, the chip package module 10 of FIG. 2 is taken as an example. By the bidirectional conductive properties of the plating through hole electrodes 36, the circuit distribution layer 104 can be disposed adjacent to the surface S5 and a surface S6 of the circuit board 102.

The circuit board structure 100 further includes a heat dissipation apparatus 106 which is disposed on the exposed metal layer 24 of the substrate 12. The heat dissipation apparatus 106 is thermally conducted with the chip package module 10 through the exposed metal layer 24 of the substrate 12. In this embodiment, the heat dissipation apparatus 106 includes a pressure-resistant insulating material 108 and a heat sink 110.

In this embodiment, the interior or exterior of the circuit board structure 100 may further be assembled with other functional chips 112 by, for example, the wire bonding or other electrical connections, as shown in FIG. 5.

FIG. 6 is a cross-sectional view of a circuit board structure in accordance with the first embodiment of the disclosure. Referring to FIGS. 5 and 6, the distinction between the circuit board structure 100 of this embodiment and the circuit board structure 100 of FIG. 5 is that, the metal layer 24 of the substrate 12 of this embodiment is not exposed from the circuit board 102. That is, in the circuit board structure 100 of this embodiment, the chip package module 10 is embedded in the circuit board 102. A metal layer 118 is disposed between the heat dissipation apparatus 106 and the circuit board 102. Furthermore, the metal layer 118 is connected to the metal layer 24 of the substrate 12 in the chip package module 10 and the heat dissipation apparatus 106 through a plurality of thermally conductive pillars 120. In some embodiments, the thermally conductive pillars 120 may include, for example, copper or other thermally conductive metals or thermally conductive materials.

FIGS. 7-10 are cross-sectional views of a chip package module in accordance with the second embodiment of the disclosure.

Figure 7:
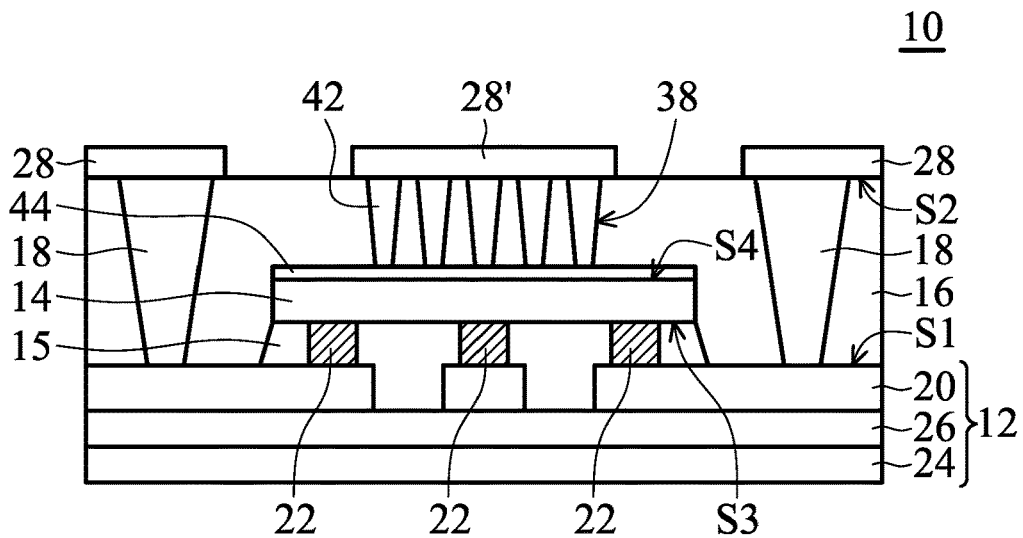
FIGS. 7-10 are cross-sectional views of a chip package module in accordance with the second embodiment of the disclosure.

Referring to FIGS. 1 and 7, the distinction between the chip package module 10 of this embodiment and the chip package module 10 of FIG. 1 is that, in the chip package module 10 of this embodiment, a metal layer 44 is further formed on the fourth surface S4 of the chip 14, and the chip package module 10 further includes at least one cavity 38 passing through the second surface S2 of the encapsulation layer 16. The cavity 38 is filled with a thermally conductive material, for example metal, to form a thermally conductive pillar 42. The thermally conductive pillar 42 is connected to a metal layer 28' and the metal layer 44 which is formed on the fourth surface S4 of the chip 14. In this embodiment, the heat generated from the chip 14 can be upwardly conducted to the second surface S2 of the encapsulation layer 16 through the thermally conductive pillar 42 and further laterally conducted through the metal layer 28' on the second surface S2. In some embodiments, the thermally conductive pillar 42 may include, for example, copper or other thermally conductive metals or thermally conductive materials. In this embodiment, the thermally conductive pillar 42 includes a plurality of cavities 38. In one embodiment, the thermally conductive pillar 42 may be an electrically conductive pillar, and the metal layer 28' may be a circuit distribution layer.

In another embodiment, a chip package module 10 (not shown) which is similar to the chip package module 10 of FIG. 7, 8, 9 or 10 is provided. In the chip package module 10 of this embodiment, a conductive pad is further formed on the fourth surface S4 of the chip 14. The chip package module 10 includes at least one cavity 38. The cavity 38 is filled with a conductive material and passes through the second surface S2 of the encapsulation layer 16 to electrically connect with the conductive pad on the chip 14 and the metal layer 28'.

Figure 8:
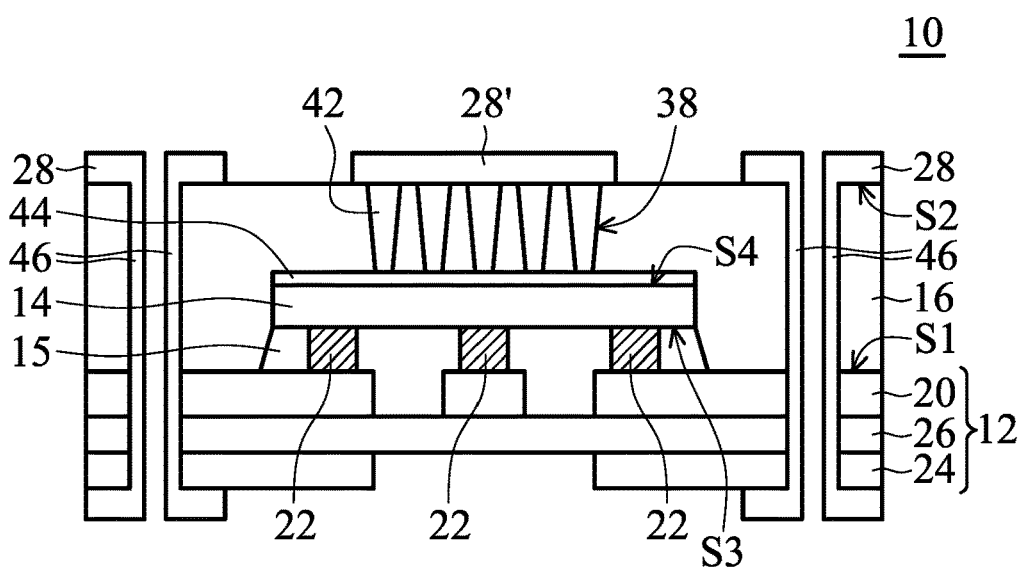
Figure 9:
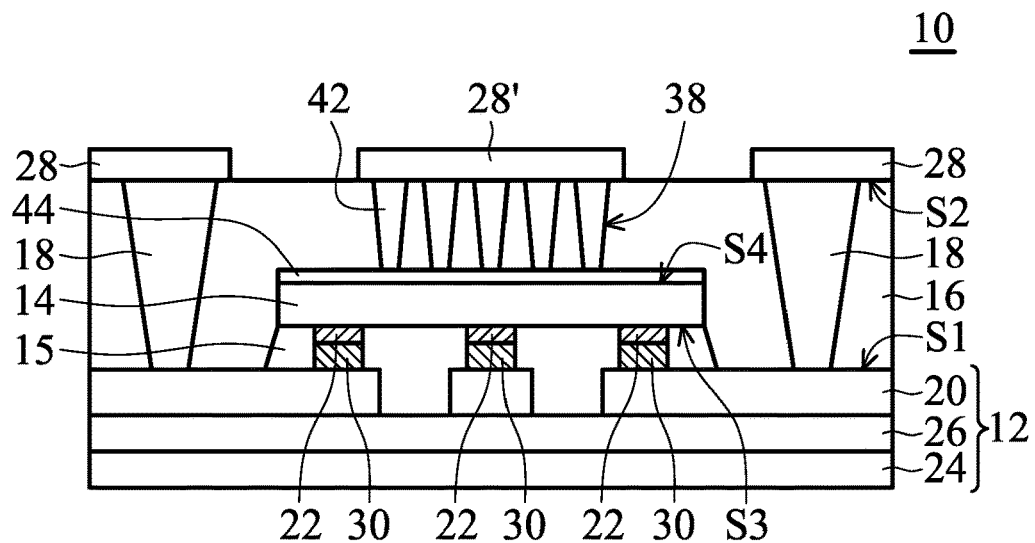
Figure 10:
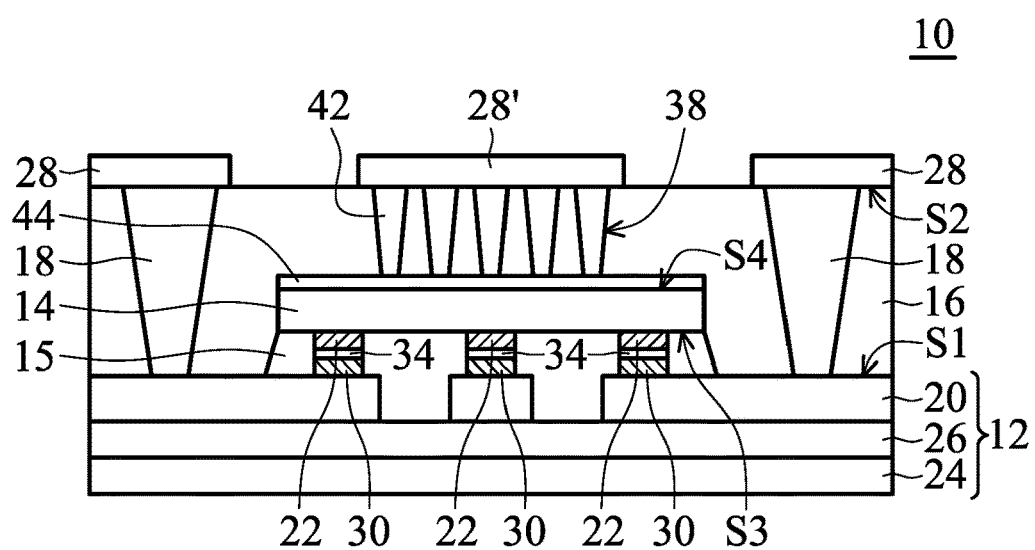

FIG. 8 is a cross-sectional view of a chip package module in accordance with the second embodiment of the disclosure. Referring to FIGS. 7 and 8, the distinction between the chip package module 10 of this embodiment and the chip package module 10 of FIG. 7 is that, in the chip package module 10 of this embodiment, a plurality of plating through hole electrodes 46 replace the blind-hole electrodes 18 of FIG. 7. The plating through hole electrodes 46 pass through the encapsulation layer 16 and the substrate 12. The connection manner between the chip 14 and the metal layer 20 of the substrate 12 may include the connection manner as shown in FIG. 9 or FIG. 10. In some embodiments, the plating through hole electrodes 46 may include, for example, copper or other conductive metals. The chip 14 is electrically connected to the metal layer 28' of the chip package module 10 through the metal layer 20 of the substrate 12 and the plating through hole electrodes 46.

FIG. 9 is a cross-sectional view of a chip package module in accordance with the second embodiment of the disclosure. Referring to FIGS. 7 and 9, the distinction between the chip package module 10 of this embodiment and the chip package module 10 of FIG. 7 is that, in the chip package module 10 of this embodiment, between the chip 14 and the metal layer 20 of the substrate 12, a metal bump 30 is further fabricated between the metal layer 20 of the substrate 12 and the metal bump 22. The chip 14 is bonded to the metal layer 20 of the substrate 12 through the metal bump 22 and the metal bump 30. The metal bump 30 may include solder alloy, copper, silver, indium, gold, palladium, titanium, manganese, cobalt or an alloy thereof, but not limited thereto. In some embodiments, the metal bump 30 does not contain solder alloy.

FIG. 10 is a cross-sectional view of a chip package module in accordance with the second embodiment of the disclosure. Referring to FIGS. 9 and 10, the distinction between the chip package module 10 of this embodiment and the chip package module 10 of FIG. 9 is that, in the chip package module 10 of this embodiment, between the chip 14 and the metal layer 20 of the substrate 12, a metal bump 34 is further fabricated between the metal bump 30 and the metal bump 22. The chip 14 is bonded to the metal layer 20 of the substrate 12 through the metal bump 22, the metal bump 34 and the metal bump 30. The metal bump 22 and the metal bump 30 may be homogeneous metal (e.g., copper). The metal bump 34 may include solder alloy, copper, silver, indium, gold, palladium, titanium, manganese, cobalt or an alloy thereof, but not limited thereto. In some embodiments, the metal bump 34 does not contain solder alloy.

Figure 11:
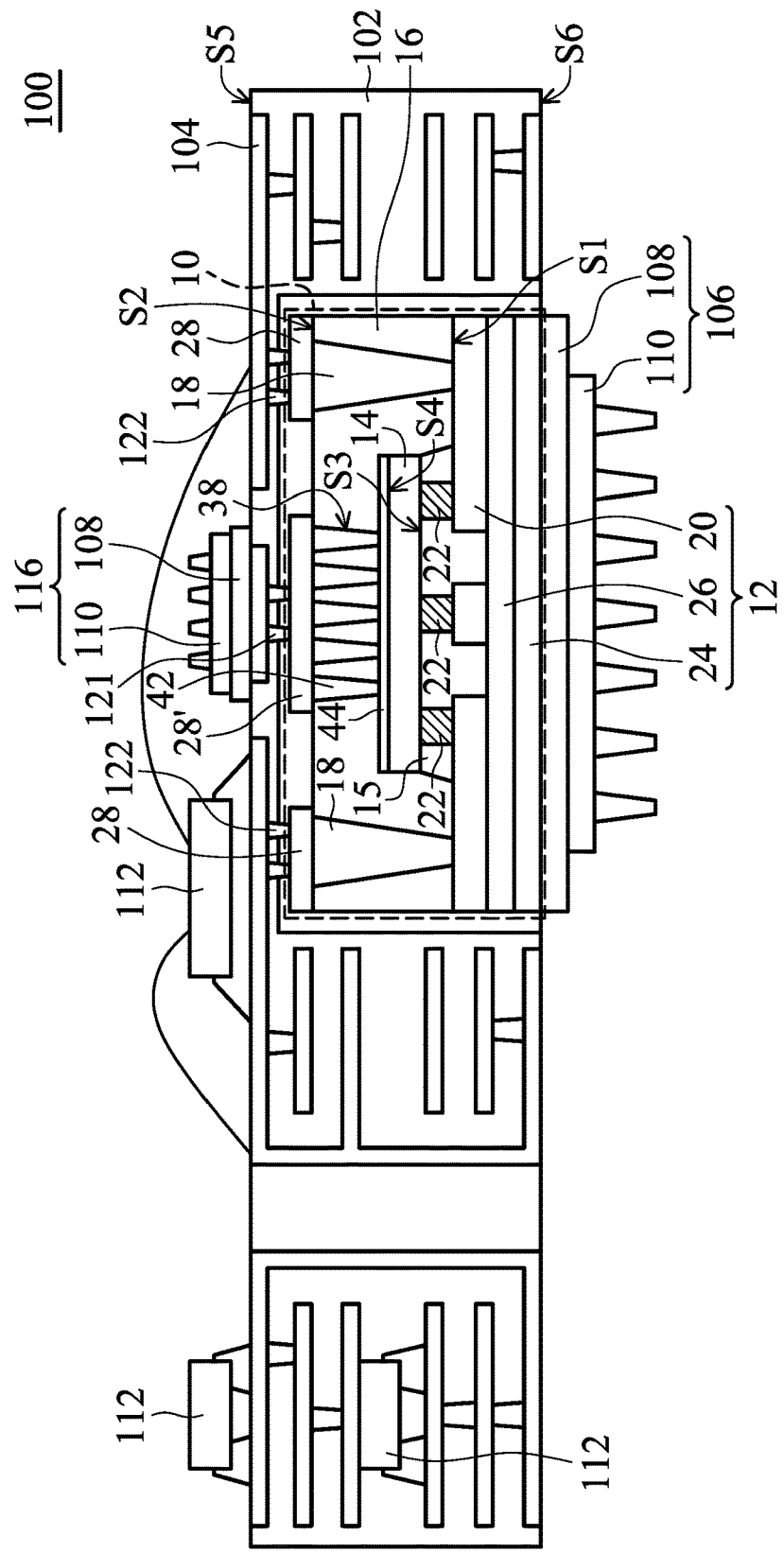
FIGS. 11 and 12 are cross-sectional views of a circuit board structure in accordance with the second embodiment of the disclosure.
Figure 12:
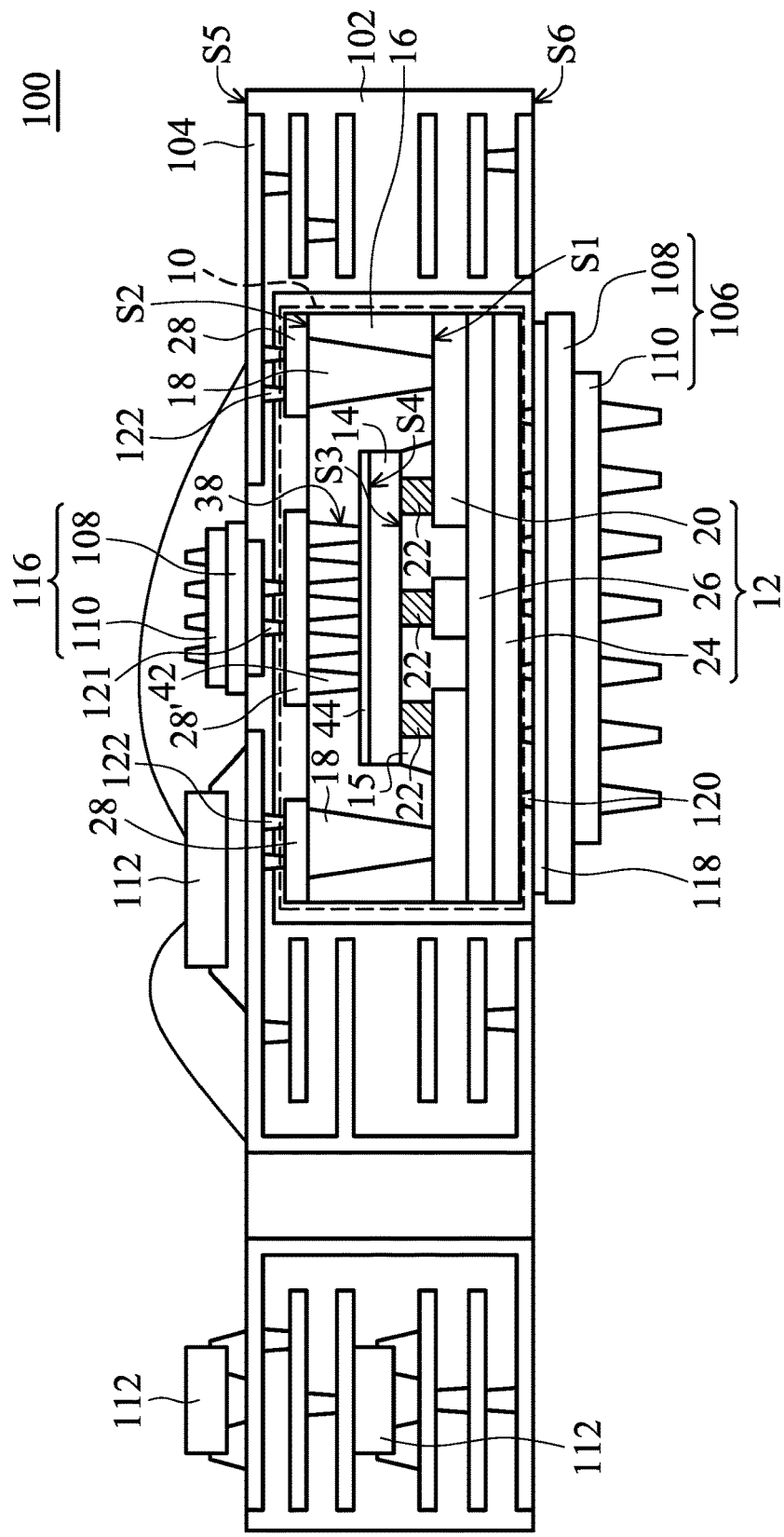

FIGS. 11 and 12 are cross-sectional views of a circuit board structure in accordance with the second embodiment of the disclosure.

Referring to FIG. 11, in this embodiment, a circuit board structure 100 includes a circuit board 102 and the chip package module 10 of FIG. 7, 8, 9 or 10 embedded in the circuit board 102. This embodiment takes the chip package module 10 of FIG. 7 as an example. Referring to FIGS. 5 and 11, the distinction between the circuit board structure 100 of this embodiment and the circuit board structure 100 of FIG. 5 is that, the circuit board structure 100 of this embodiment further includes a heat dissipation apparatus 116 disposed on the surface S5 of the circuit board 102, opposite to the heat dissipation apparatus 106. The chip package module 10 further includes at least one cavity 38 passing through the second surface S2 of the encapsulation layer 16. The cavity 38 is filled with a thermally conductive material to form a thermally conductive pillar 42. The thermally conductive pillar 42 is connected to a metal layer 28' and the metal layer 44 which is formed on the fourth surface S4 of the chip 14. The circuit distribution layer 104 of the circuit board structure 100 is disposed adjacent to the surface S5 of the circuit board 102. A part of the circuit distribution layer 104 is located between the heat dissipation apparatus 116 and the circuit board 102. The heat dissipation apparatus 116 is connected to the fourth surface S4 of the chip 14 through the circuit distribution layer 104, a thermally conductive pillar 121, the metal layer 28' and the thermally conductive pillar 42 by order, to conduct the heat out from the back of the chip 14. In some embodiments, the thermally conductive pillar 121 may include, for example, copper or other thermally conductive metals or thermally conductive materials. The heat dissipation apparatus 106 and the heat dissipation apparatus 116 include a pressure-resistant insulating material 108 and a heat sink 110.

FIG. 12 is a cross-sectional view of a circuit board structure in accordance with the second embodiment of the disclosure. Referring to FIGS. 11 and 12, the distinction between the circuit board structure 100 of this embodiment and the circuit board structure 100 of FIG. 11 is that, the metal layer 24 of the substrate 12 of this embodiment is not exposed from the circuit board 102. That is, in the circuit board structure 100 of this embodiment, the chip package module 10 is embedded in the circuit board 102. A metal layer 118 is disposed between the heat dissipation apparatus 106 and the circuit board 102. The metal layer 118 is connected to the metal layer 24 of the substrate 12 in the chip package module 10 and the heat dissipation apparatus 106 through a plurality of thermally conductive pillars 120.

In the circuit board structure of the second embodiment of the disclosure, the substrate is formed by stacking the high-heat-dissipating insulating material layer and the thermally conductive and/or electrically conductive metal layers which are located on the upper and lower sides of the high-heat-dissipating insulating material layer. Also, the metal layer with heat-dissipating function is provided on the back of the chip to conduct the heat generated from the chip to the outside. Therefore, in accordance with one embodiment of the disclosure, the chip package structure possesses the double-sided heat-dissipating performance (e.g., the two-directional heat dissipation pathway respectively from the chip back and the substrate).

FIGS. 13-16 are cross-sectional views of a chip package module in accordance with the third embodiment of the disclosure.

Figure 13:
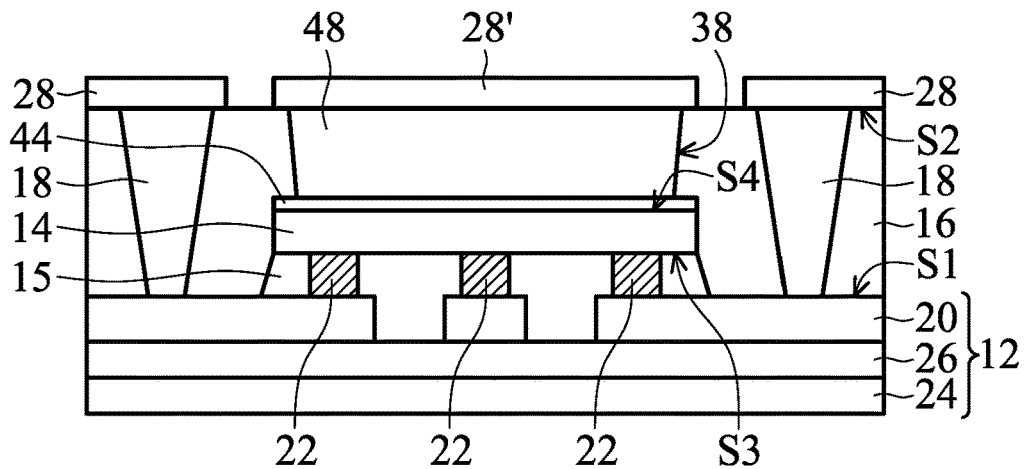
FIGS. 13-16 are cross-sectional views of a chip package module in accordance with the third embodiment of the disclosure.

Referring to FIGS. 7 and 13, the distinction between the chip package module 10 of this embodiment and the chip package module 10 of FIG. 7 is that, in the chip package module 10 of this embodiment, there is one cavity 38. Furthermore, the single cavity 38 is filled with, for example, copper or other thermally conductive metals or thermally conductive materials to form a thermally conductive bulk 48.

Figure 14:
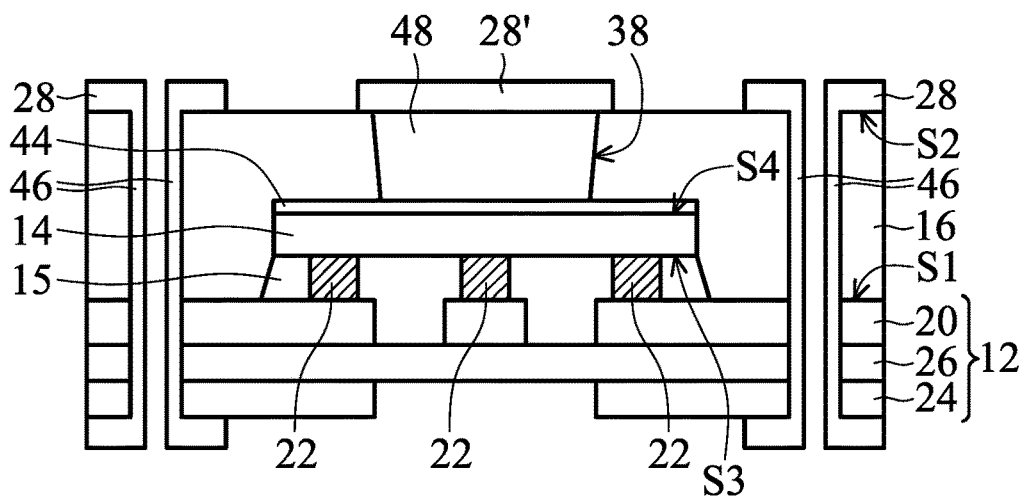

FIG. 14 is a cross-sectional view of a chip package module in accordance with the third embodiment of the disclosure. Referring to FIGS. 8 and 14, the distinction between the chip package module 10 of this embodiment and the chip package module 10 of FIG. 8 is that, in the chip package module 10 of this embodiment, there is one cavity 38. Furthermore, the single cavity 38 is filled with, for example, copper or other thermally conductive metals or thermally conductive materials to form a thermally conductive bulk 48.

Figure 15:
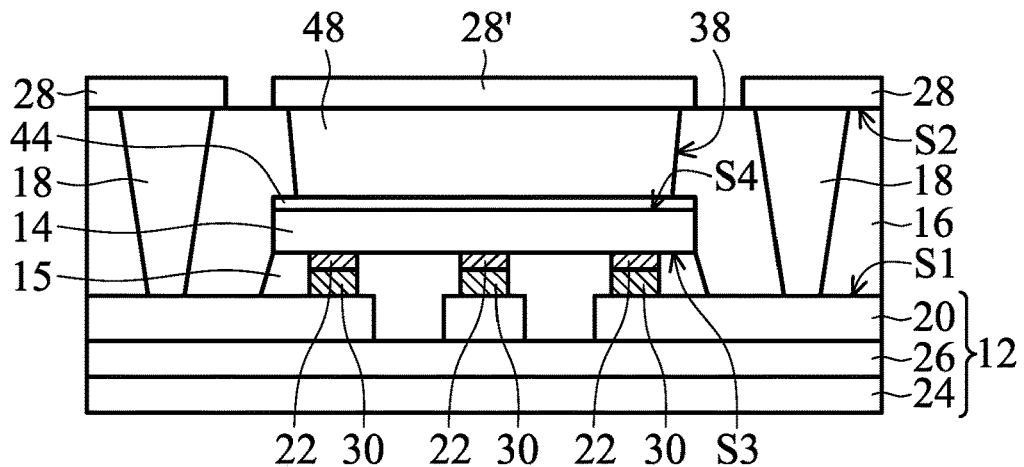

FIG. 15 is a cross-sectional view of a chip package module in accordance with the third embodiment of the disclosure. Referring to FIGS. 9 and 15, the distinction between the chip package module 10 of this embodiment and the chip package module 10 of FIG. 9 is that, in the chip package module 10 of this embodiment, there is one cavity 38. Furthermore, the single cavity 38 is filled with, for example, copper or other thermally conductive metals or thermally conductive materials to form a thermally conductive bulk 48.

Figure 16:
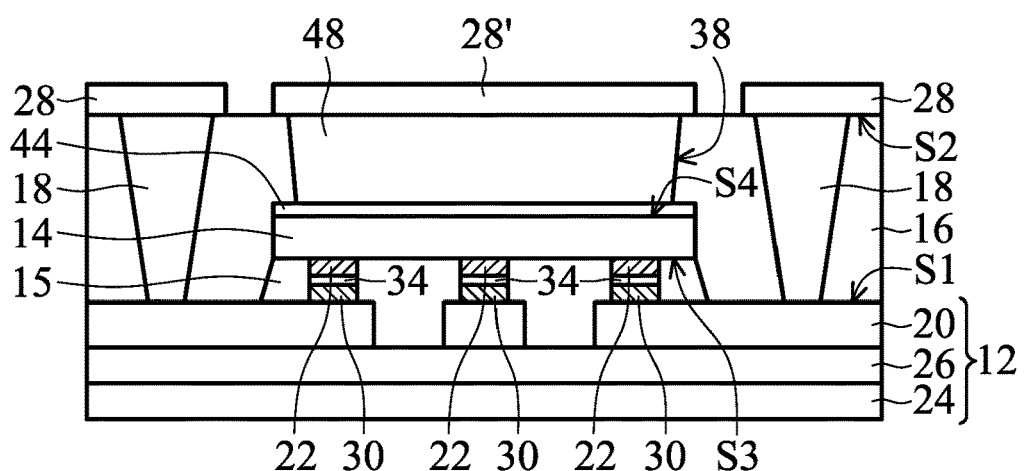

FIG. 16 is a cross-sectional view of a chip package module in accordance with the third embodiment of the disclosure. Referring to FIGS. 10 and 16, the distinction between the chip package module 10 of this embodiment and the chip package module 10 of FIG. 10 is that, in the chip package module 10 of this embodiment, there is one cavity 38. Furthermore, the single cavity 38 is filled with, for example, copper or other thermally conductive metals or thermally conductive materials to form a thermally conductive bulk 48.

Figure 17:
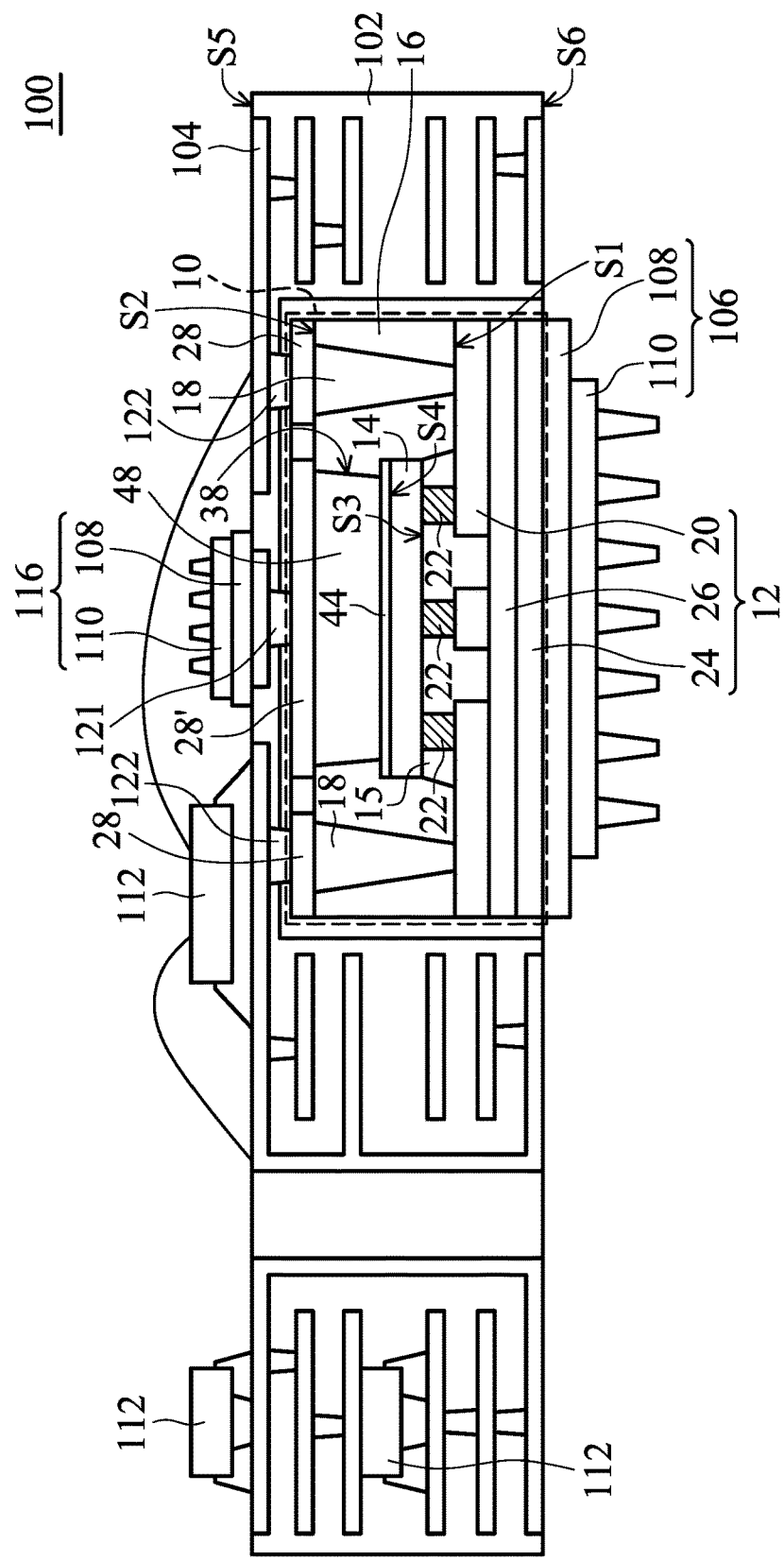
FIGS. 17 and 18 are cross-sectional views of a circuit board structure in accordance with the third embodiment of the disclosure.
Figure 18:
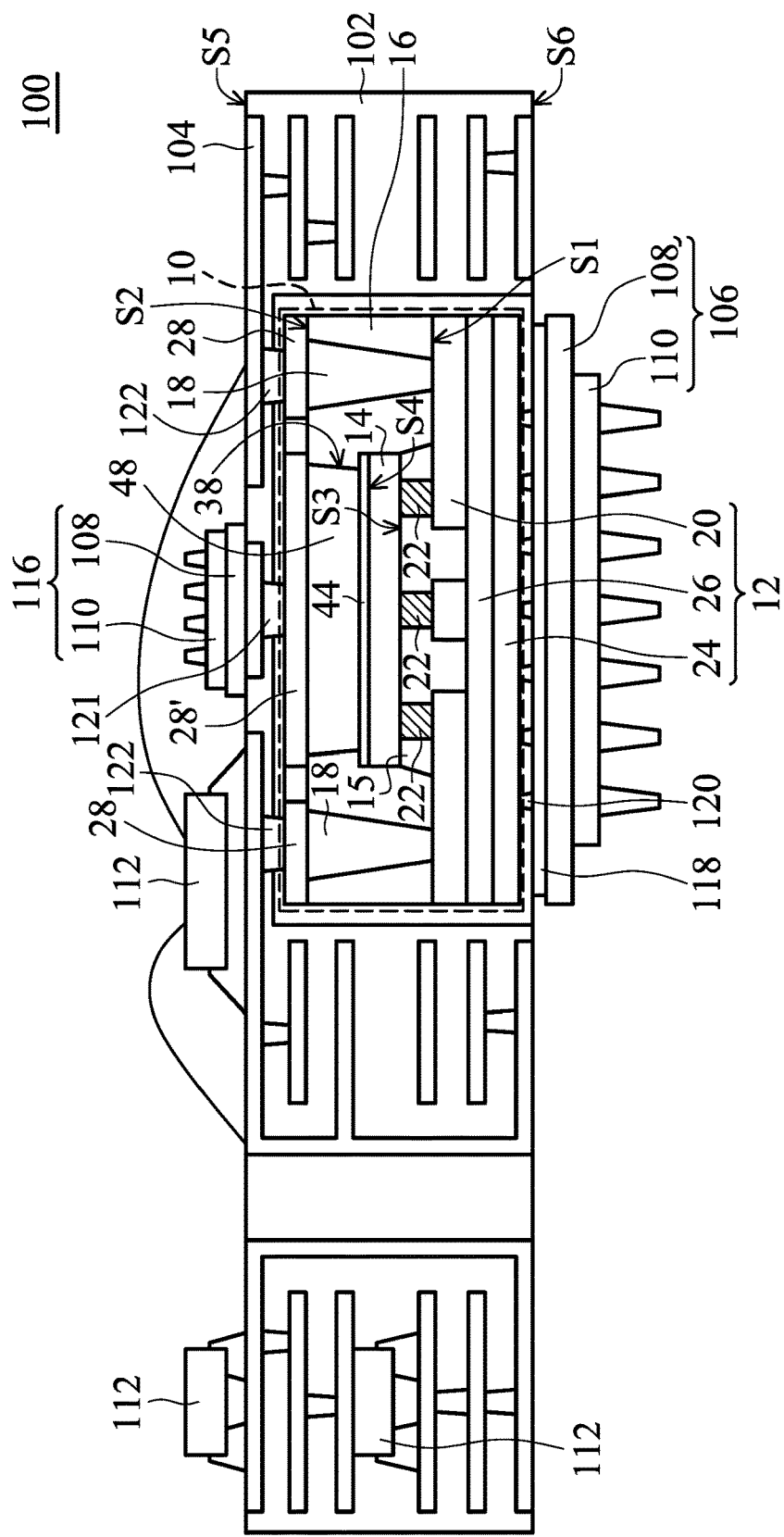

FIGS. 17 and 18 are cross-sectional views of a circuit board structure in accordance with the third embodiment of the disclosure.

Referring to FIG. 17, in this embodiment, a circuit board structure 100 includes a circuit board 102 and the chip package module 10 of FIG. 13, 14, 15 or 16 embedded in the circuit board 102. This embodiment takes the chip package module 10 of FIG. 13 as an example. Referring to FIGS. 11 and 17, the distinction between the circuit board structure 100 of this embodiment and the circuit board structure 100 of FIG. 11 is that, in the circuit board structure 100 of this embodiment, there is one cavity 38. Furthermore, the single cavity 38 is filled with, for example, copper or other thermally conductive metals or thermally conductive materials to form a thermally conductive bulk 48.

FIG. 18 is a cross-sectional view of a circuit board structure in accordance with the third embodiment of the disclosure. Referring to FIGS. 12 and 18, the distinction between the circuit board structure 100 of this embodiment and the circuit board structure 100 of FIG. 12 is that, in the circuit board structure 100 of this embodiment, there is one cavity 38. Furthermore, the single cavity 38 is filled with, for example, copper or other thermally conductive metals or thermally conductive materials to form a thermally conductive bulk 48.

In accordance with one embodiment of the present disclosure, since the metal-metal bonding material between the chip and the substrate may not contain solder alloy, a hole-shaped defect that causes component breakage is not easily generated in the material structure even when a large current passes through the bonding portion, which is very conducive to the stability of the electrical properties of the components, and achieves the characteristics of high current resistance, high conductivity, and low impedance. In accordance with one embodiment of the present disclosure, the circuit board package structure is suitable for large-area heterogeneous integration of mass production. Furthermore, since the present disclosure embeds a smaller chip package module into a system board, such as a printed circuit board (PCB), through the integration of the circuit distribution layer, the volume of the overall package structure is further miniaturized to achieve a thinned effect.

While the disclosure has been described by way of example and in terms of preferred embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package module, comprising:
   an encapsulation layer having a first surface and a second surface opposite to the first surface;
   a chip having a third surface and a fourth surface opposite to the third surface which is embedded into the encapsulation layer from the first surface of the encapsulation layer;
   a metal bump fabricated on the third surface of the chip and exposed from the first surface of the encapsulation layer;
   a substrate comprising a metal layer, wherein the metal layer of the substrate is bonded to the chip through the metal bump;
   a plurality of electrodes passing through the encapsulation layer and electrically connected to the metal layer of the substrate;
   a metal layer formed on the fourth surface of the chip; and
   at least one cavity passing through the encapsulation layer from the second surface of the encapsulation layer, wherein the at least one cavity is filled with thermal material and is in contact with the metal layer on the chip.

2. The chip package module as claimed in claim 1, wherein the plurality of electrodes are plating through hole electrodes passing through the encapsulation layer and the substrate.

3. The chip package module as claimed in claim 2, wherein the metal layer of the substrate comprises copper or aluminum.

4. The chip package module as claimed in claim 2, wherein the metal bump fabricated on the chip comprises solder alloy, copper, silver, indium, gold, palladium, titanium, manganese, cobalt or an alloy thereof.

5. The chip package module as claimed in claim 2, wherein the metal bump does not contain solder alloy.

6. The chip package module as claimed in claim 2, further comprising a metal layer formed on the fourth surface of the chip and at least one cavity passing through the encapsulation layer from the second surface of the encapsulation layer, wherein the at least one cavity is filled with thermal material and is in contact with the metal layer on the chip.

7. The chip package module as claimed in claim 2, wherein the plurality of plating through hole electrodes are located at at least one side around the chip.

8. A circuit board structure, comprising:
   a circuit board comprising a circuit distribution layer, wherein the circuit distribution layer is disposed adjacent to at least one surface of the circuit board; and
   a chip package module as claimed in claim 2 embedded in the circuit board, wherein at least one of the plurality of plating through hole electrodes of the chip package module is electrically connected to the circuit distribution layer of the circuit board.

9. The circuit board structure as claimed in claim 8, further comprising a heat dissipation apparatus disposed on one surface of the circuit board, wherein the chip package module further comprises at least one cavity passing through the encapsulation layer from the second surface of the encapsulation layer, and the at least one cavity filled with thermal material is in contact with the fourth surface of the chip, wherein the heat dissipation apparatus is thermally conducted with the at least one cavity.

10. The circuit board structure as claimed in claim 8, further comprising a heat dissipation apparatus disposed on one surface of the circuit board, wherein the heat dissipation apparatus is located on the first surface of the encapsulation layer of the chip package module and thermally conducted with the chip package module.

11. A circuit board structure, comprising:
   a circuit board comprising a circuit distribution layer, wherein the circuit distribution layer is disposed adjacent to at least one surface of the circuit board; and
   a chip package module embedded in the circuit board, wherein the chip package module comprises:
   an encapsulation layer having a first surface and a second surface opposite to the first surface;
   a chip having a third surface and a fourth surface opposite to the third surface which is embedded into the encapsulation layer from the first surface of the encapsulation layer;
   a metal bump fabricated on the third surface of the chip and exposed from the first surface of the encapsulation layer;
   a substrate comprising a metal layer, wherein the metal layer of the substrate is bonded to the chip through the metal bump; and
   a plurality of electrodes passing through the encapsulation layer and electrically connected to the metal layer of the substrate,
   wherein the plurality of electrodes are blind-hole electrodes passing through the encapsulation layer from the second surface of the encapsulation layer,
   wherein at least one of the plurality of blind-hole electrodes of the chip package module is electrically connected to the circuit distribution layer of the circuit board.

12. The circuit board structure as claimed in claim 11, wherein the metal layer of the substrate comprises copper or aluminum.

13. The circuit board structure as claimed in claim 11, wherein the metal bump fabricated on the chip comprises solder alloy, copper, silver, indium, gold, palladium, titanium, manganese, cobalt or an alloy thereof.

14. The circuit board structure as claimed in claim 11, wherein the chip is a power chip.

15. The circuit board structure as claimed in claim 14, wherein the metal bump does not contain solder alloy.

16. The circuit board structure as claimed in claim 11, further comprising a conductive pad formed on the fourth surface of the chip and at least one cavity passing through the encapsulation layer from the second surface of the encapsulation layer, wherein the at least one cavity is electrically connected to the conductive pad on the chip.

17. The circuit board structure as claimed in claim 11, wherein the plurality of blind-hole electrodes are located at at least one side around the chip.

18. The circuit board structure as claimed in claim 11, further comprising a heat dissipation apparatus disposed on one surface of the circuit board, wherein the chip package module further comprises at least one cavity passing through the encapsulation layer from the second surface of the encapsulation layer, and the at least one cavity filled with thermal material is in contact with the fourth surface of the chip, wherein the heat dissipation apparatus is thermally conducted with the at least one cavity.

19. The circuit board structure as claimed in claim 11, further comprising a heat dissipation apparatus disposed on one surface of the circuit board, wherein the heat dissipation apparatus is located on the first surface of the encapsulation layer of the chip package module and thermally conducted with the chip package module.

\* \* \* \* \*